(12) United States Patent
Knudsen

(10) Patent No.: US 6,359,575 B1
(45) Date of Patent: Mar. 19, 2002

(54) ANALOG TO DIGITAL CONVERTER HAVING A DIGITAL TO ANALOG CONVERTER MODE

(75) Inventor: Niels Knudsen, Humleback (DK)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 09/458,539

(22) Filed: Dec. 9, 1999

(51) Int. Cl.[7] ............................. H03M 1/10; H03M 1/06
(52) U.S. Cl. ..................................... 341/118; 341/120
(58) Field of Search .......................... 341/143, 118, 341/120, 144, 155; 329/307; 250/208

(56) References Cited

U.S. PATENT DOCUMENTS

| | | | | |
|---|---|---|---|---|
| 5,248,970 A | * | 9/1993 | Sooch et al. ............... | 341/120 |
| 5,514,865 A | * | 5/1996 | O'Neil ....................... | 250/208 |
| 5,572,210 A | * | 11/1996 | Toyoda ....................... | 341/144 |
| 5,781,137 A | | 7/1998 | Knudsen | |
| 5,781,138 A | | 7/1998 | Knudsen | |
| 5,995,033 A | * | 11/1999 | Roeckner et al. ........... | 341/155 |
| 6,016,112 A | | 1/2000 | Knudsen | |
| 6,020,838 A | | 2/2000 | Knudsen et al. | |
| 6,049,298 A | | 4/2000 | Knudsen | |

OTHER PUBLICATIONS

Delta–Sigma Data Converters, IEEE Press, 1997, Chapter pp. 244–281.

* cited by examiner

*Primary Examiner*—Patrick Wamsley
(74) *Attorney, Agent, or Firm*—Conley, Rose & Tayon PC; Jeffrey C. Hood

(57) ABSTRACT

An analog to digital (A/D) converter which includes A/D converter and D/A converter modes. The A/D converter includes an internal digital to analog (D/A) converter (DAC) that may be used in a feedback loop during A/D operations (in the A/D mode), and may be used as a stand-alone D/A converter in the D/A mode. The present invention also takes advantage of advanced calibration techniques available for the internal D/A converter of the A/D converter. A processing unit may be coupled to the output of the internal A/D converter. The processing unit or a separate computer system may perform a calibration function in the A/D mode to generate linearity error correction information for correcting linearity errors in the internal D/A converter. The linearity error correction information may be used in configuring a linearity error correction device implemented by the processing unit. In the A/D mode, the processing unit may implement linearity error correction and a decimation function during A/D conversion. In the D/A mode, the processing unit also may implement linearity error correction functions as well as other functions during D/A conversion. The A/D converter may also include switching elements used in configuring the A/D converter in either the A/D mode or the D/A mode.

37 Claims, 11 Drawing Sheets

ANALOG TO DIGITAL CONVERTER HAVING A DIGITAL TO ANALOG CONVERTER MODE

FIELD OF THE INVENTION

This invention relates to the art of analog-to-digital (A/D) converters and digital-to-analog (D/A) converters.

DESCRIPTION OF THE RELATED ART

Analog-to-digital converters (ADCs) are circuits used to convert signals from the analog domain, where the signals are represented by continuous quantities such as voltage and current, to the digital domain, where the signals are represented by numbers. These circuits can be implemented in a large number of ways. Established A/D conversion techniques include flash, delta-sigma (or sigma-delta), subranging, successive approximation, and integrating.

ADC's typically include an internal digital to analog (D/A) converter. The D/A converter may be comprised in a feedback loop in the ADC. One example of an A/D converter is an over-sampled A/D converter. Oversampled A/D converters, often denoted as "delta-sigma converters" or "sigma-delta converters" are well known in the art. A delta sigma (D/S) converter essentially digitizes an analog signal at a very high sampling rate (oversampling) in order to perform a noise shaping function. The digitized signal is provided to an internal D/A converter to produce an analog signal, which is then supplied through a feedback loop to be combined with the analog input signal.

FIG. 1 shows, in block diagram form, a D/S converter 10 commonly known in the art. The D/S converter 10 may be a single bit or multi-bit delta sigma converter. The D/S converter 10 includes a D/S modulator 12 connected to a digital filter and decimation circuit 14. The D/S modulator 12 includes a summing node 16, a filter 18, an A/D converter 20, and a D/A converter 22. The D/A converter 22 is connected to the output of the A/D converter 20 and operates to provide feedback to the summing node 16. The summing node 16 includes a pair of inputs, one being connected to the analog input signal $V_{in}$ and the other being connected to the output of the D/A converter 22.

In operation, the output of summing node 16 is low-pass filtered by filter 18 and subsequently converted into a digital signal by A/D converter 20. The digital signal in turn is converted back into an analog signal by D/A converter 22 and subtracted from analog input signal $V_{in}$ at summing node 16.

The D/S modulator 12 converts the input signal $V_{in}$ into a continuous serial bit stream at a rate determined by sampling clock frequency, $kf_s$. Due to the feedback provided by the D/A converter 22 the average value output by the D/A converter 22 approaches that of the input signal $V_{in}$ if the loop has enough gain.

A multi-bit D/S converter provides benefits over a single bit D/S converter implementation. Namely, a multi-bit D/S converter provides more resolution and less quantization noise. Additionally, a multi-bit D/S converter is more stable than single bit D/S converter. However, the multi-bit D/S converter suffers from linearity errors introduced by the internal multi-bit D/A converter.

Linearity error is the inability of the multi-bit D/A converter to accurately translate a digital input value into an analog current or voltage. In other words, given a particular digital input, the resulting analog output of the multi-bit internal D/A converter 62 approximates the digital value but is not exactly equal to the digital value. In reality, the actual analog output differs from the digital input value by an amount equal to the linearity error.

FIG. 2 shows a graphical comparison of an ideal linear vs. non-ideal, non-linear multi-bit D/A converter. The horizontal axis represents the codes or multi-bit digital signals applied to the inputs of both types of multi-bit D/A converters, ideal and non-ideal. The vertical axis represents the analog signal output therefrom. Line L represents the transfer function of the ideal or linear D/A converter. Line NL represents the transfer function of the non-ideal or non-linear D/A converter. Variations between the two lines represent the linearity errors. The distance between points on a vertical line through both line L and the line NL represent the linearity error produced by the non-ideal D/A converter for a particular input code. For example, if digital code x is input to both the ideal D/A converter and the non-ideal D/A converter, the respective outputs would be $Y_L$ and $Y_{NL}$. The difference in voltage $\Delta Y$ represents the linearity error corresponding to digital code x. This linearity error is viewed as noise and degrades the ultimate signal to noise ratio of the D/S converter which contains the non-linear D/A converter. This linearity error is static in nature and independent of frequency and voltage.

The source of linearity errors can be traced to the internal current generators of the multi-bit D/A converter. FIG. 3 shows, in schematic form, a simplified D/A converter 70 employing a number of internal current generators 72. Each of the internal current generators 72 is selectively connected to an output node 74 via switches 76. Each switch 76 contains an input configured to receive one bit of the digital code inputted to the D/A converter 70. For example, switch $S_{N-1}$ is controlled by the most significant bit of the input digital code. When the most significant bit is 1, the associated current generator is connected to summing node 74. Thus, given a particular digital input code, the output of one or more of the current generators 72 is connected to the summing node 74.

If the D/A converter 70 was ideal and contained ideal current generators, current would be generated therefrom in integer units. For example, if the D/A converter 70 of FIG. 3 was an ideal 3 bit D/A converter, and a digital code inputted thereto equaled 111, the three ideal internal current generators 72 would generate 4, 2, and 1 units of current, respectively. However, internal current generators are rarely ideal. Given an input code 111, the non-ideal set of current generators, for example, might generate 4.05, 1.98, and 1.01 units of current, respectively.

The linearity error produced by the internal current generators can be further traced to a variety of causes, chief of which is the inability of integrated circuit manufacturers to form, in silicon, current generators having identical geometries. Several other causes can be related to the linearity error. Over time and use, the internal current generators may wear differently. Moreover, temperature variations may occur between the internal current generators. In any event, the physical differences between internal current generators in a D/A converter, even though slight, can produce significant errors in the translation of a digital input code into an analog equivalent.

U.S. Pat. Nos. 5,781,137 and 5,781,138 describe a system and method which operate to calibrate the internal D/A converter of a multi-bit A/D converter to eliminate or otherwise reduce linearity errors in the multi-bit A/D converter. The technique disclosed in these patents includes applying a known analog waveform, such as a pure sine wave, to an input of the A/D converter, or to a portion of the A/D converter, and generating digital signals representative of the pure sine wave. A number of the digital signals output from the converter are recorded. These recorded digital signals contain hidden information regarding the linearity errors associated with the internal D/A converter of the A/D converter. The linearity error information can be extracted and used in deriving correction coefficients and constructing a linearity error correction circuit. The linearity error correction circuit then can be used to correct for linearity errors in the A/D converter.

The system and method described in the above patents operate to calibrate the internal D/A converter and remove linearity errors from the internal D/A converter. Once the internal D/A converter has been calibrated, it would be more desirable to more fully take advantage of the internal D/A converter for other purposes.

SUMMARY OF THE INVENTION

The present invention comprises an analog to digital (A/D) converter which includes A/D converter and D/A converter modes. The A/D converter includes an internal digital to analog (D/A) converter (DAC) that may be used in a feedback loop during A/D operations (in the A/D mode), and may be used as a stand-alone D/A converter in the D/A mode. The present invention also takes advantage of advanced calibration techniques available for the internal D/A converter of the A/D converter.

The A/D converter may include a summing node, a loop filter, a multi-bit internal A/D converter, and a multi-bit D/A converter which are comprised in a feedback loop. A processing unit may be coupled to the output of the internal A/D converter. The processing unit may provide an output to an acquisition memory in the A/D mode. The acquisition memory may in turn provide an output to a host computer.

The processing unit and/or a separate computer system may perform a calibration function in the A/D mode to generate linearity error correction information for correcting linearity errors in the internal D/A converter. The linearity error correction information may be used in configuring a linearity error correction device, such as a look up table, implemented by the processing unit. In the A/D mode, the processing unit may implement the linearity error correction and a decimation function during A/D conversion. In the D/A mode, the processing unit also may implement the linearity error correction as well as other functions during D/A conversion.

In the A/D mode, calibration may operate as follows. First, a known analog waveform, such as a pure sine wave, is applied to the ADC. The processing unit may operate to extract linearity error information and then construct a look up table (LUT) from the linearity error information. This LUT may then be used to correct for internal errors in the D/A converter. In each of the A/D mode and the D/A mode, the processing unit may implement correction using the calibration look-up table. Thus, in each of the A/D mode and the D/A mode, the internal D/A converter may have reduced linearity errors.

The A/D converter also may include a first switching element and a second switching element for configuring the A/D mode or the D/A mode. The first switching element receives the output from the internal ADC and receives an output from the processing unit (comprising the external DAC input) and selectively provides one of these input signals as an output to the internal DAC. The second switching element receives the output from the internal DAC and selectively provides an output to either the summing node or to an external DAC output.

In the A/D mode, the first switching element provides the output from the internal ADC as the input to the internal DAC, and the second switching element provides the output from the internal DAC to the summing node. This thereby enables normal operation of the feedback loop during analog to digital conversion.

In the D/A mode, the DAC input is provided to the processing unit. In the D/A mode, the processing unit may implement one or more of an interpolation filter, summation node, H(z) transfer function, a rounder and the linearity error correction LUT, wherein the linearity error correction LUT is configured in a feedback path. The processing unit receives the DAC input and processes the DAC input using the above elements. The processing unit provides an output through the first switching element as the input to the internal DAC. The second switching element provides the output from the internal DAC to the external DAC output.

This thereby enables the internal D/A converter to function as a D/A converter for external signals. In other words, whereas in prior art A/D converters the internal D/A converter of the A/D converter is used solely during analog to digital conversion, in the A/D converter of the present invention, the internal D/A converter, in conjunction with the processor, is also useable to perform digital to analog conversion functions for external signals. In addition, linearity error information can be extracted from the internal DAC and used in calibrating the internal DAC during both the A/D mode and the D/A mode.

BRIEF DESCRIPTION OF THE DRAWINGS

A better understanding of the present invention can be obtained when the following detailed description of the preferred embodiment is considered in conjunction with the following drawings, in which.

Figure 1:
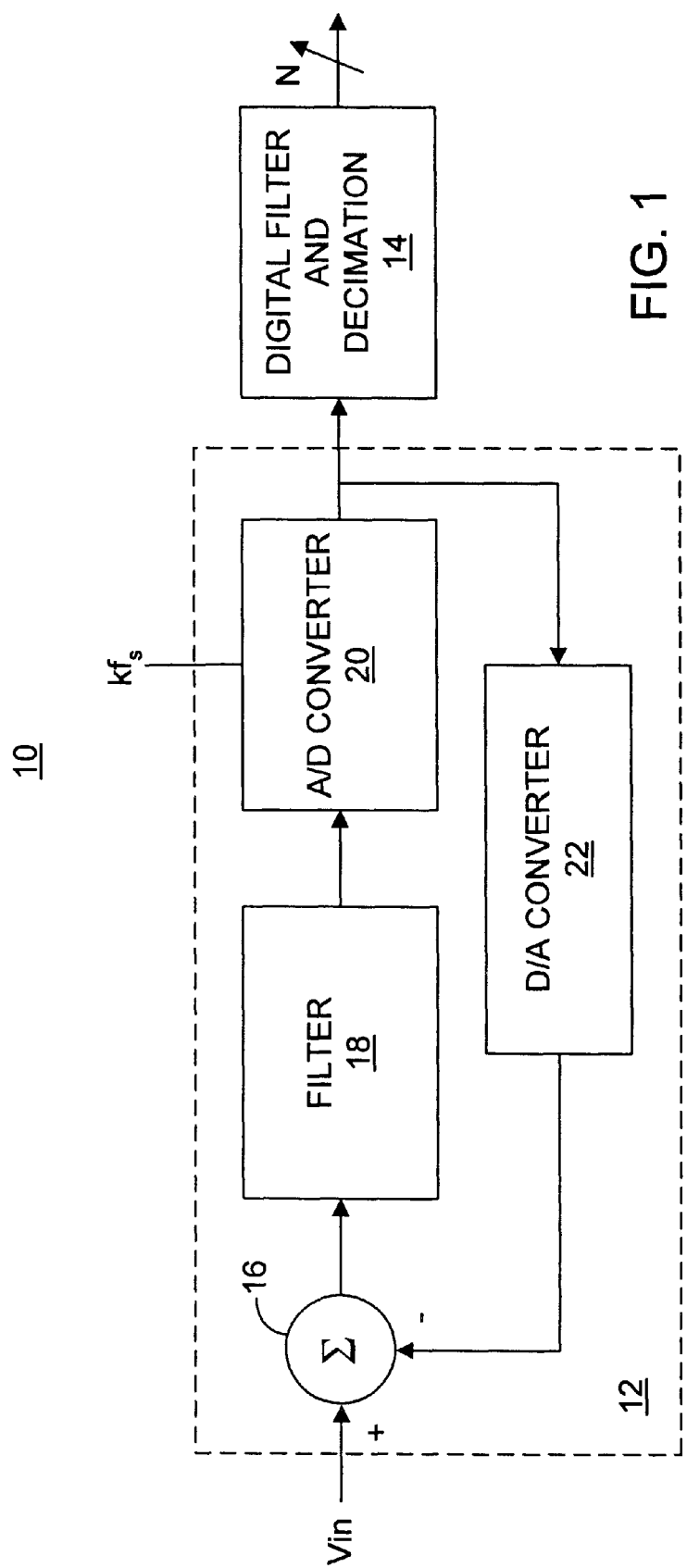
FIG. 1 represents a prior art D/S converter in block form.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Incorporation by Reference

The following are hereby incorporated by reference as though fully and completely set forth herein.

U.S. Pat. No. 5,781,138 titled "System and Method for Generating a Sigma-Delta Correction Circuit" and filed Dec. 23, 1996, whose inventor was Niels Knudsen;

U.S. Pat. No. 5,781,137 titled "System and Method for Reducing Errors in a Delta Sigma Converter" and filed Dec. 23, 1996, whose inventor was Niels Knudsen;

U.S. patent application Ser. No. 09/200,543 titled "System and Method for Generating a Sigma-Delta Correction Circuit" and filed Nov. 25, 1998, whose inventor was Niels Knudsen, U.S. patent application Ser. No. 09/199,937 titled "System and Method for Reducing Errors in a Delta Sigma Converter" and filed Nov. 25, 1998, whose inventor was Niels Knudsen;

U.S. patent application Ser. No. 09/186,314 titled "System and Method for Generating a Sigma-Delta Correction Circuit Using Matrix Calculation of Linearity Error Correction Coefficients" and filed on Nov. 4, 1998, whose inventors were Niels Knudsen and Mark Whittington; and U.S. patent application Ser. No. 09/351,759 titled "System and Method for Calibrating an Analog to Digital Converter Through Stimulation of Current Generators" and filed on Jul. 12, 1999, whose inventor was Niels Knudsen.

Figure 4:
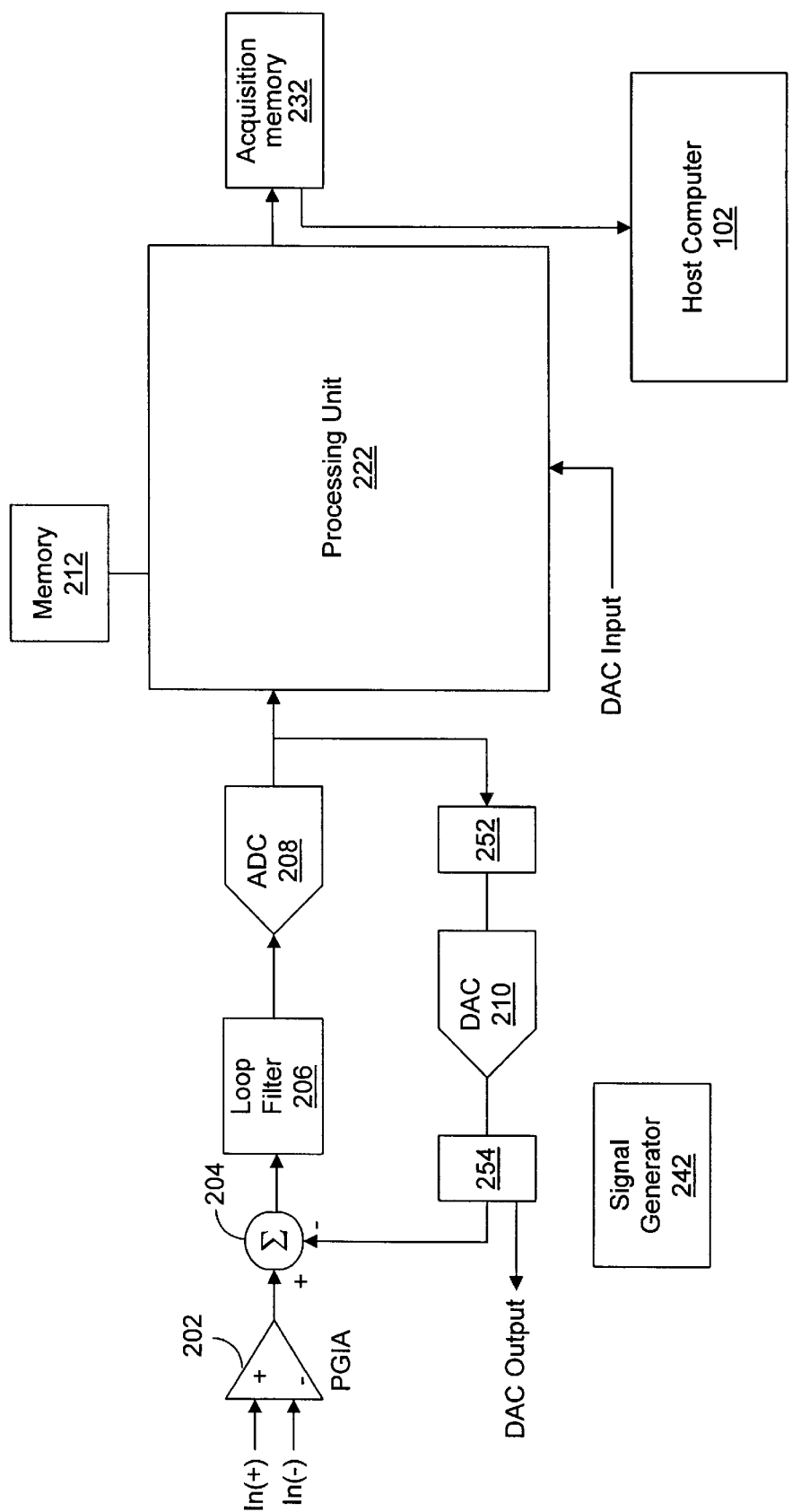
FIG. 4 illustrates an A/D converter having A/D and D/A modes according to the present invention.

FIG. 4—Analog to Digital (A/D) Converter System

FIG. 4 illustrates an analog to digital (A/D) converter system having A/D and D/A modes according to the present invention. The present invention may be comprised in a data acquisition (DAQ) system, such as that shown in FIG. 11. Thus, for example, the A/D converter system may be coupled to a host computer system 102. However, the present invention may be included in any of various types of systems where an analog to digital converter is used, i.e., where analog data is converted to digital data. Examples of systems where the present invention may be used include data acquisition systems, instrumentation systems, test and measurement systems, industrial automation systems, process control systems, communications systems, audio systems, image acquisition systems and video systems, among others.

The present invention may be used with any of various types of A/D converters, including integrating A/D converters, flash A/D converters, sigma-delta A/D converters, sub-ranging A/D converters, and successive approximation A/D converters, among others. The A/D converter includes, for example, one or more internal digital to analog (D/A) converters which are used in the D/A mode. The one or more internal D/A converters may also generate linearity errors (also referred to as linear errors). In the following description, the present invention is described with reference to a delta-sigma (also called sigma-delta) A/D converter as one example of the operation of the present invention. The present invention is preferably used with a delta-sigma A/D converter. However, this description does not limit the invention to use with only delta-sigma (D/S) A/D converters, but rather as noted above the present invention may be used with any of various types of A/D converters.

FIG. 4 shows an example A/D converter, in this case a multi-bit D/S converter, employing one embodiment of the present invention. As noted above, the present invention may be used with any of various types of A/D converters, and in the present description the present invention is described with reference to a delta-sigma A/D converter as one example of the operation of the present invention. However, the present invention may readily apply to other types of A/D converters which include internal D/A converters.

In addition, the present invention is described with reference to a particular calibration technique for compensating or correcting linearity errors associated with current generators in the internal D/A converter of the A/D converter. However, the present invention readily applies to other calibration techniques for compensating or correcting linearity errors associated with current generators in the internal D/A converter. Thus the calibration technique disclosed herein is exemplary only.

The DAQ device 104 may include a PGIA (programmable gain instrumentation amplifier) 202 which receives In(+) and In(−) signals. The PGIA couples to the D/S converter of the present invention, which in turn couples to an acquisition memory 232. The acquisition memory is shown coupled to host computer 102. The DAQ device 104 may include an on-board signal generator 242, such as a sine wave generator, for use in the calibration. Alternatively, the waveform generator 242 is not used. For example, the A/D converter may include a logical ground or other reference which is used as the analog input signal for calibration, or the input may be left floating during calibration.

The D/S converter includes a delta sigma modulator, wherein the delta sigma modulator comprises a summing node 204, a loop filter 206, a multi-bit internal A/D converter 208, and a multi-bit D/A converter 210. The summing node 204, loop filter 206, multi-bit internal A/D converter 208, and multi-bit D/A converter 210 are comprised in a feedback loop, as shown.

A processing unit (processor) 222, such as an FPGA (field programmable gate array), a microcontroller, a programmable CPU (central processing unit) or programmable DSP (digital signal processor), may be coupled to the output of the internal A/D converter 208. If the processing unit 222 executes instructions from a memory, memory 212 may be coupled to the processing unit 222, wherein the processing unit 222 executes instructions from the memory 212. In the preferred embodiment, the processing unit 222 is an FPGA or other type of programmable logic.

As discussed below, the processing unit 222 may perform a digital calibration function, preferably in the A/D mode, to generate a table of linearity error correction values. These values may then be used to correct for linearity errors in one or both of the A/D mode and the D/A mode. In the A/D mode, the processing unit 222 may implement a correction function (using the table of linearity error correction values) and a decimation function during A/D conversion. The processing unit 222 may then provide an output to an acquisition memory 232. The acquisition memory 232 may in turn provide an output to a host computer 102. In the D/A mode, the processing unit 222 receives an external DAC input, as shown. The processing unit 222 then may implement a correction function (using the table of linearity error correction values) and other functions during D/A conversion, and provide an output to the internal D/A converter 210. The D/A converter 210 then generates an analog output signal in response to the digital input signal.

The A/D converter also includes a first switching element 252 and a second switching element 254. The first switching element 252 receives the output from the internal ADC 208 and receives an output from the processing unit 222 (in response to the external DAC input) and selectively provides one of these input signals as an output to the DAC 210. The second switching element 254 receives the output from the internal DAC 210 and selectively provides an output to either the summing node 204 or to an external DAC output.

In the A/D mode, the first switching element 252 provides the output from the internal ADC 208 as the input to the internal DAC 210. Also, the second switching element 254 selectively provides the output from the internal DAC 210 to the summing node 204. This thereby enables normal operation of the feedback loop during analog to digital conversion.

Figure 8:
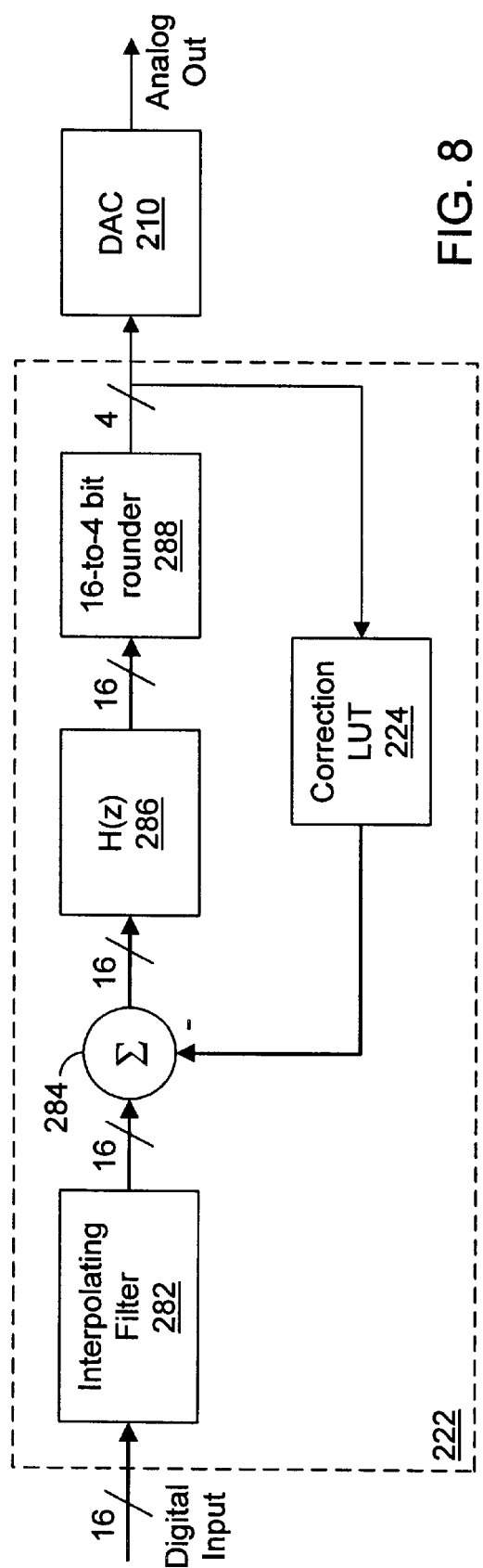
FIG. 8 is a more detailed block diagram of a portion of the A/D converter of FIG. 4 operating in the D/A mode.

In the D/A mode, the DAC input is provided to the processing unit 222. In the D/A mode, the processing unit 222 may implement one or more of an interpolation filter, summation node, H(z) transfer function, a rounder and the linearity error correction LUT, configured in a feedback path. The configuration of elements implemented by the processing unit 222 in the D/A mode in one embodiment is shown in FIG. 8. The processing unit 222 receives the DAC input and processes the DAC input using the above elements. The first switching element 252 then receives the resulting output from the processing unit 222 and provides this output as the input to the internal DAC 210. The second switching element 254 selectively provides the output from the internal DAC 210 to the external DAC output.

This thereby enables the internal D/A converter 210 to function as a D/A converter for external signals. In other words, whereas in prior art A/D converters the internal D/A converter 210 is used solely during analog to digital conversion, in the A/D converter of the present invention, the internal D/A converter 210 also performs a digital to analog conversion function for signals.

As noted above, the processing unit 222 may implement calibration functions, preferably in the A/D mode. In the A/D mode, the processing unit 222 may perform a calibration operation and generate a look-up table containing linearity error correction values for correcting linearity errors in the internal D/A converter.

In the A/D mode, calibration may operate as follows. First, a known analog waveform, such as a pure sine wave, may be applied to the A/D converter system. The processing unit 222 may operate to extract linearity errors in response to the input and then construct a look up table (LUT) from the linearity errors. This LUT may then be used to correct for internal errors in the D/A converter during both A/D conversion and D/A conversion, i.e., in both the A/D mode and the D/A mode. Thus, in the D/A mode, the processing unit 222 may implement correction using the calibration look-up table created in the A/D mode. Thus, in the D/A mode, the internal D/A converter 210 may have reduced linearity errors. The calibration operation is described in greater detail below as well as in the above patents and applications incorporated by reference herein.

Figure 5:
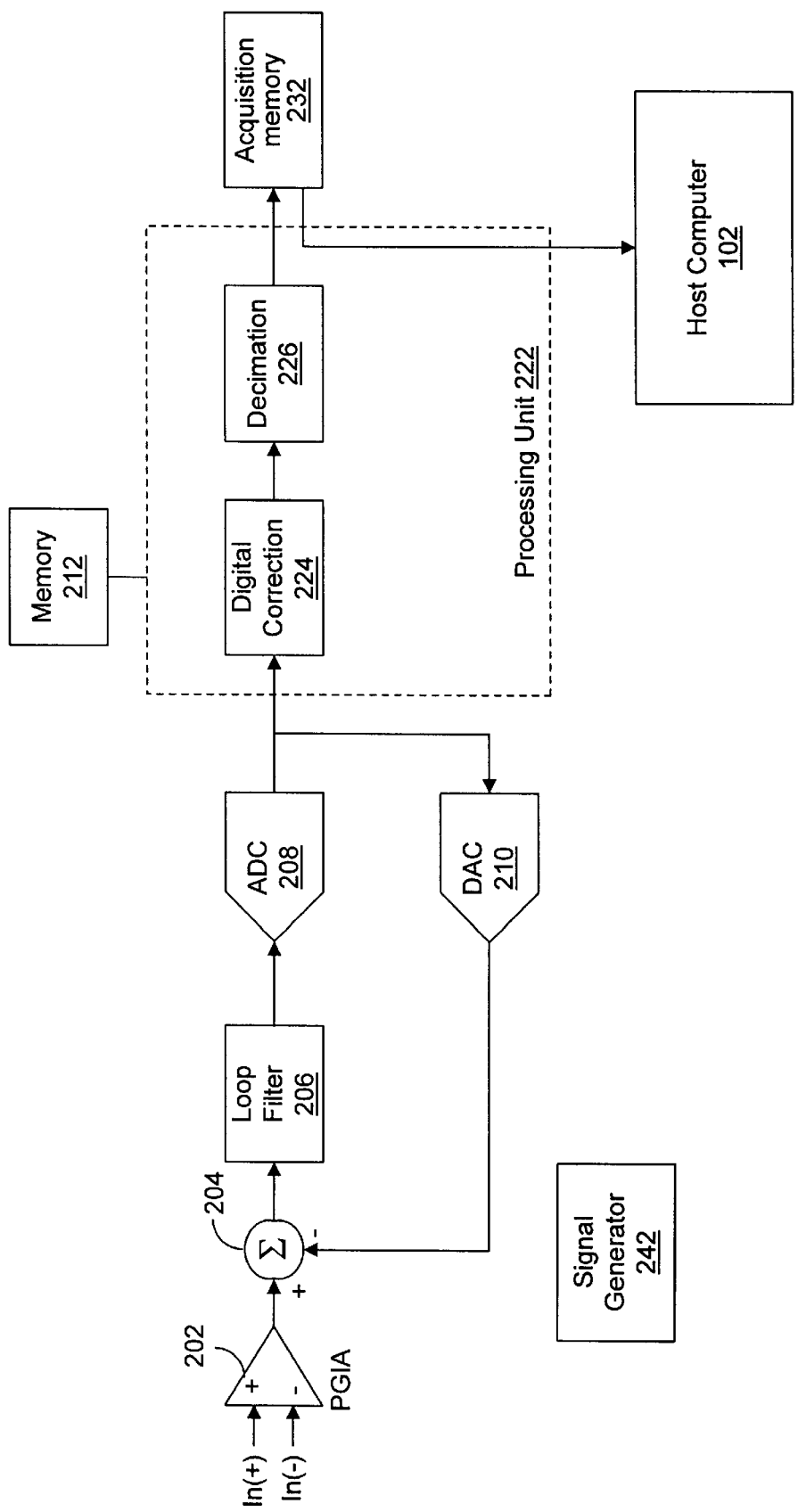
FIG. 5 illustrates the A/D converter of FIG. 4 operating in the A/D mode.

FIG. 5—A/D Converter in A/D Mode

FIG. 5 illustrates the A/D converter in the A/D mode. In FIG. 5, the switches 252 and 254 are configured to provide signals paths to implement the A/D mode as shown. The switches 252 and 254 are not shown in FIG. 5 for ease of illustration.

During A/D operation, the D/S modulator comprising summing node 204, loop filter 206, multi-bit internal A/D converter 208, and multi-bit D/A converter 210, performs in substantially the same manner as prior art multi-bit D/S converters. Namely, filter 206 applies a low-pass filter function to the output of summing node 204. The filtered signal in turn is converted into a digital equivalent by A/D converter 208. D/A converter 210 is positioned in a feedback loop between the output of the A/D converter 208 and an input of the summing node 204. Thus, the output of the D/A converter 210 is translated into an analog equivalent which is subtracted from analog input signal $V_{in}$ inputted to summing node 204. Due to the feedback signal provided, the output of the D/A converter 210 approaches that of the input signal if the loop has enough gain.

As discussed above, in the A/D mode the first switching element 252 (shown in FIG. 4) provides the output from the ADC 208 as the input to the DAC 210, and the second switching element 254 (shown in FIG. 4) selectively provides the output from the DAC 210 to the summing node 204. This thereby enables normal operation of the feedback loop during analog to digital conversion.

In the A/D mode, the processing unit 222 may implement a linearity error correction circuit 224 and a digital filter and decimation circuit 226. As shown, the linearity error correction (digital correction) block 224 and the digital filter and decimation block 226 may be placed in series between the D/S modulator and the acquisition memory 232.

Linearity error (L/E) correction block or circuit 224 may thus be connected to the output of the D/S modulator. Digital signals generated by the D/S modulator may be corrected or linearized by the L/E correction circuit 224 before being digitally filtered and decimated. The L/E correction block 224 linearizes the D/S modulator 82 by removing or substantially reducing the linearity errors in output digital signals. The L/E correction block 224 removes or reduces linearity errors by adjusting the output of the D/S modulator to compensate for the linearity error. In particular, the L/E correction circuit 224 may utilize a look-up table to map values output from the D/S modulator which have linearity errors to new values with reduced linearity errors. Given that the L/E correction circuit 224 linearizes the D/S modulator 82, the D/S converter 80 employing the L/E correction circuit 224 may ultimately produce a digital signal having reduced linearity errors and a higher resolution. Accordingly, the number of bits representing the digital output of the digital filter and decimator 226 can be enhanced or increased.

Thus, the processing unit 222 may operate to perform digital correction operations, such as through implementation of a look-up table created during calibration. The digital correction preferably operates to correct for linearity errors in the internal D/A converter 210.

The digital filter and decimation circuit block 226, as implemented by processing unit 222, preferably operates substantially in the same way as prior art digital filter and decimation circuits. Namely, the digital filter and decimation block 226 provides low-pass digital filtering and a resampling of the digital signals inputted thereto, where the resampling occurs at a rate $f_s$.

Figure 6:
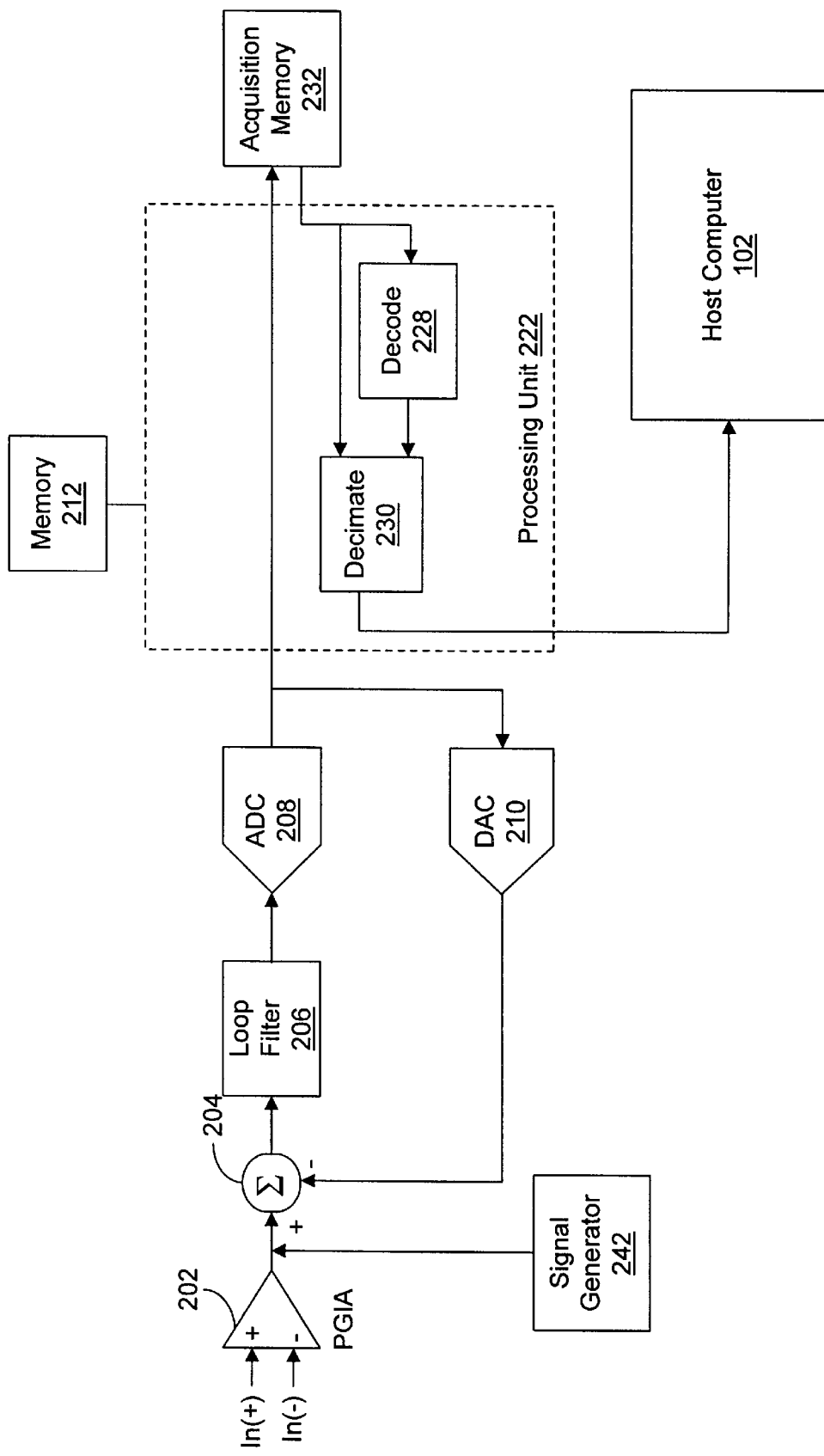
FIG. 6 illustrates the A/D converter of FIG. 4 operating in a calibration mode.

FIG. 6—A/D Converter Configured for Calibration

FIG. 6 illustrates the A/D converter of FIG. 4, also called the D/S converter, wherein the processing unit 222 is configured to perform calibration. In FIG. 6, the switches 252 and 254 are configured to provide signals paths to implement the A/D mode as shown. The switches 252 and 254 are not shown in FIG. 6 for ease of illustration.

In the present embodiment, the calibration is performed in the a/D mode. In an alternate embodiment, calibration may be performed in the D/A mode. In the calibration mode, the first and second switching elements 252 and 254 preferably operate as in the A/D mode. Thus the first switching element 252 provides the output from the internal ADC 208 as the input to the internal DAC 210, and the second switching element 254 provides the output from the internal DAC 210 to the summing node 204. This enables normal operation of the feedback loop during the analog to digital conversion that is performed during calibration.

During calibration, an analog signal, e.g., a constant voltage or current or waveform, may be connected to the input of the summing node 204, as shown. In one embodiment, a constant input, such as a logical ground, is connected to the D/S converter during calibration, and a switching element (not shown) in the internal DAC 210 operates to selectively connect the inputs of the internal DAC 210 to different current generators within the internal DAC 210, thereby causing different current generators to be stimulated for the purpose of calibration. For more information on this embodiment, please see co-pending application Ser. No. 09/351,759 titled "System and Method for Calibrating an Analog to Digital Converter Through Stimulation of Current Generators" and filed Jul. 12, 1999, which is hereby incorporated by reference.

The D/S converter receives the analog input and generates a plurality of samples S, which are recorded in the acquisition memory 232. The samples S produced by the D/S converter carry linearity error information for most or all of the current generators within the internal DAC 210.

As shown, the processing unit 222 may be programmed to perform a decimation function 230 on the recorded samples S and provide the decimated samples to the host computer 102 for processing. The processing unit 222 may also be programmed to perform a decode function 228 on the recorded samples S to sort the signals into subsets corresponding to each of the current generators comprised in the D/S converter. After the sorting performed by the decode block 228, the decimation block 230 decimates each of the subsets and provides the decimated subsets to the host computer 102 for processing.

As discussed below, the host computer 102 may operate to extract linearity error information from these received signals. For example, in one embodiment, the host computer 102 may operate to generate linearity error correction coefficients during calibration, which may be placed in a look-up table. The linearity error correction coefficients may be used to generate a look-up table in the memory 212, which is used by the processing unit 222 when performing linearity error correction 224. The linearity error information may then be used to calibrate the output of the internal D/A converter 210 when the A/D converter is operating in either the A/D mode (as discussed above) or the D/A mode (as discussed below). This operation is discussed below.

In an alternate embodiment, a processor comprised in the A/D converter system, such as the processing unit 222, may operate to extract linearity error information from the received signals and in response generate linearity error correction coefficients. Alternatively, a programmable digital analyzer (not shown) external to the DAQ device 104 may be used to perform this function, as desired.

After the calibration operation has been completed, the analog input source may be disconnected from the input of the D/S converter. The D/S converter may then be configured as shown in FIG. 5 for A/D operations using the newly configured digital correction block 224, i.e., using the configured processing unit 222 and memory 212. The D/S converter may alternatively be configured as shown in FIG. 7 in the D/A mode for D/A operations.

As discussed above, the linearity error information generated during calibration may be used to calibrate the A/D converter system (to calibrate the internal D/A converter 210 in the A/D converter system) when the A/D converter is operating in the A/D mode. Thus the linearity error correction coefficients may be used to program the processing unit 222, i.e., the digital correction block 224, to perform digital correction on the output of the D/S modulator. In a similar manner, as discussed below, the linearity error information generated during calibration may be used to calibrate the internal D/A converter 210 during D/A mode.

Figure 7:
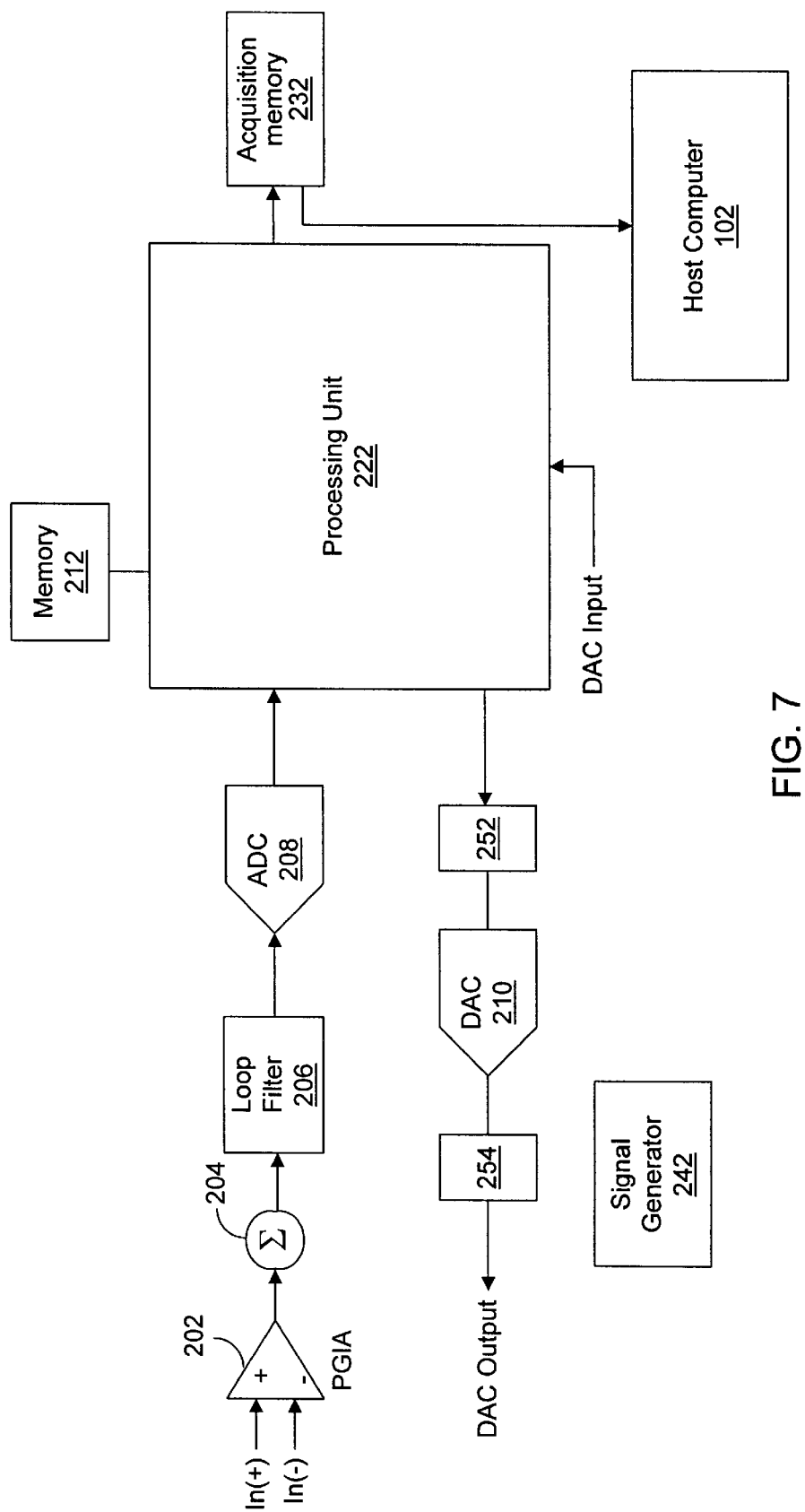
FIG. 7 illustrates the A/D converter of FIG. 4 operating in the D/A mode.

FIG. 7—A/D Converter Configured in the D/A Mode

FIG. 7 illustrates the A/D converter system of FIG. 4 configured in the D/A mode. In FIG. 7, the switches 252 and 254 are configured to provide signals paths to implement the D/A mode as shown. The switches 252 and 254 are not shown in FIG. 7 for ease of illustration.

In the D/A mode, the first and second switching elements 252 and 254 operate as follows. The first switching element 252 provides the output from the processing unit 222 as the input to the internal DAC 210, and the second switching element 254 provides the output from the internal DAC 210 as the DAC output. This enables operation of the processing unit 222 and the internal D/A converter 210 to perform digital to analog conversion.

As shown, in the D/A mode, an external digital input signal, i.e., a digital signal from an external source, is provided as the digital or DAC input. The DAC input is provided to the processing unit 222. In the D/A mode, the processing unit 222 may implement one or more of an interpolation filter, summation node, H(z) transfer function, a rounder and the linearity error correction LUT 224, wherein the linearity error correction LUT 224 is configured in a feedback path.

FIG. 8 illustrates one embodiment of the A/D converter system configured in the D/A mode. As shown, the processing unit 222 may implement interpolation filter 282, summation node 284, H(z) transfer function 286, a rounder 288 and the linearity error correction LUT 224, configured in a feedback path as shown. The output of the rounder 288 is provided to internal DAC 210, which then provides an analog output. Thus the processing unit 222 and the internal D/A converter 210 may be used to implement the system shown in FIG. 8. The processing unit 222 may implement other configurations or embodiments of a D/A converter as desired.

In the embodiment shown in FIG. 8, the sampling rate $f_c$ of the digital input signal may be raised by an over-sampling factor k. The interpolating filter 282 may be used to suppress the signal spectrum everywhere except in narrow frequency bands centered around F=0, ±kfc, 2kfc . . . where fc is the sampling rate at the input. The interpolating filter 282 provides its output to the summation node 284. The summation node 284 also receives and subtracts a feedback signal. The output of the summation node 284 is provided through a high gain filter H(z) to the rounding stage 288. The rounding stage 288 may operate to reduce the word length of the interpolated signal to, for example, 4 bits. The rounding stage 288 preferably contains a simple digital filter, e.g., an accumulator, a rounder and a memory. The internal D/A converter 210 is connected to the output of the rounder 288.

The correction lookup table 224 is also connected to the output of the rounder 288. The nonlinearity present in the internal D/A converter 210 is cancelled or reduced by the correction lookup table 224. More specifically, the correction table 224 may operate to map input digital values to output digital values with reduced linearity errors. As noted above, the correction lookup table 224 is configured or generated during a calibration phase, preferably when the A/D converter system is in the A/D mode, as discussed above with respect to FIG. 6. In addition, any noise introduced by the rounding operation performed by the rounding stage 288 may be cancelled or reduced by the high gain frequency block H(z) 286. The output of the correction lookup table 224 is provided as a feedback signal to an input of the summation node 284.

Figure 2:
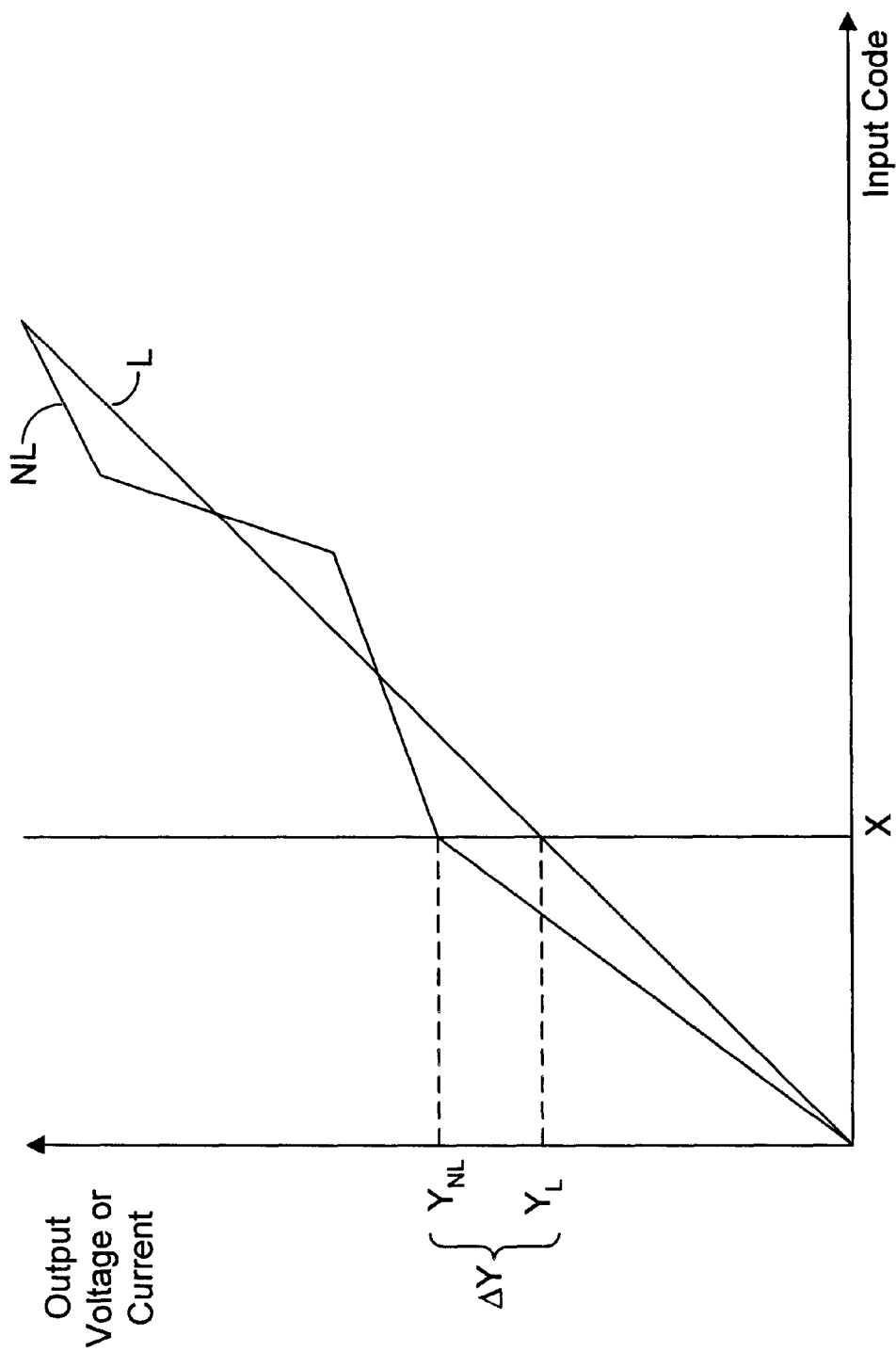
FIG. 2 is a graph representing transfer characteristics of an ideal and a non-ideal multi-bit D/A converter.
Figure 3:
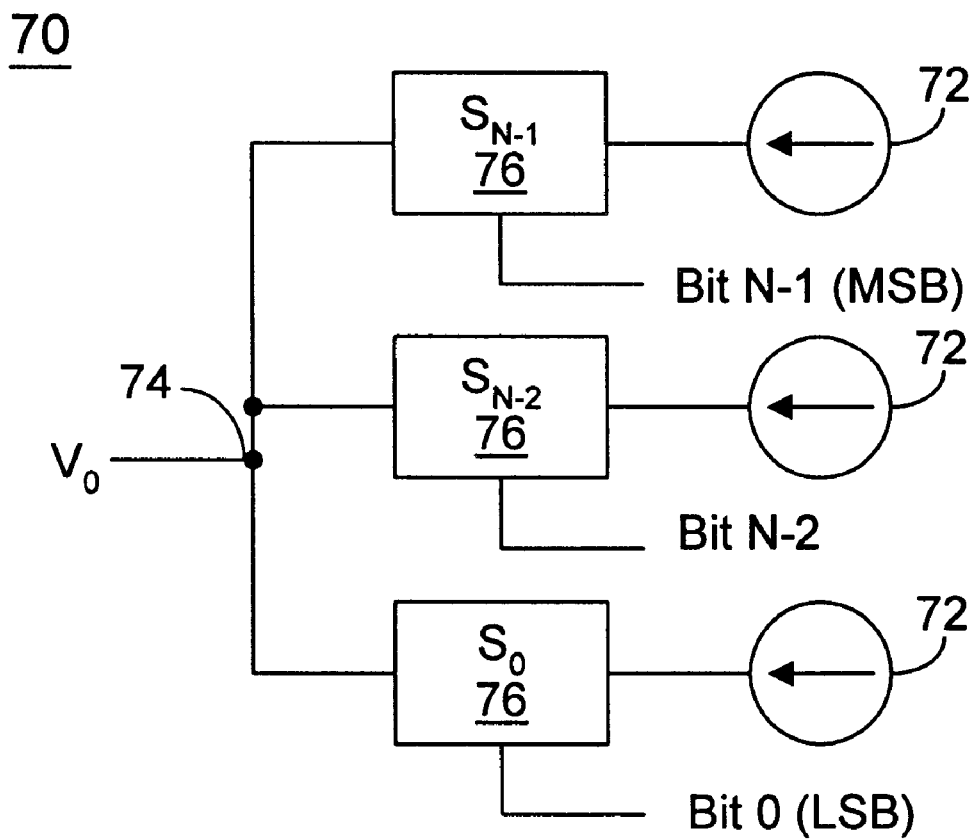
FIG. 3 illustrates a prior art D/A converter in schematic form.

For more information on the circuit of FIG. 8, please see James C. Candy & Gabor C. Themes, "Oversampling Delta-Sigma Data Converters", IEEE Press, ISBN 0-87942-258-8, pgs. 192–195, and more specifically FIG. 2 of page 194, the above article and book being hereby incorporated by reference as though fully and completely set forth herein.

Thus the processing unit 222 receives the DAC input and processes the DAC input using the above elements. The processing unit 222 then provides an output through the first switching element 252 as the input to the internal DAC 210. The second switching element 254 provides the output from the internal DAC to the external DAC output.

This thereby enables the internal D/A converter 210 to function as a D/A converter for digital signals. In other words, whereas in prior art A/D converters the internal D/A converter 210 of the A/D converter system is used solely during analog to digital conversion, in the A/D converter of the present invention, the internal D/A converter 210 is also useable in a "stand-alone fashion" to perform digital to analog conversion functions for external signals. In addition, linearity error information can be extracted from the internal DAC and used in calibrating the internal DAC during both the A/D mode and the D/A mode.

Figure 9:
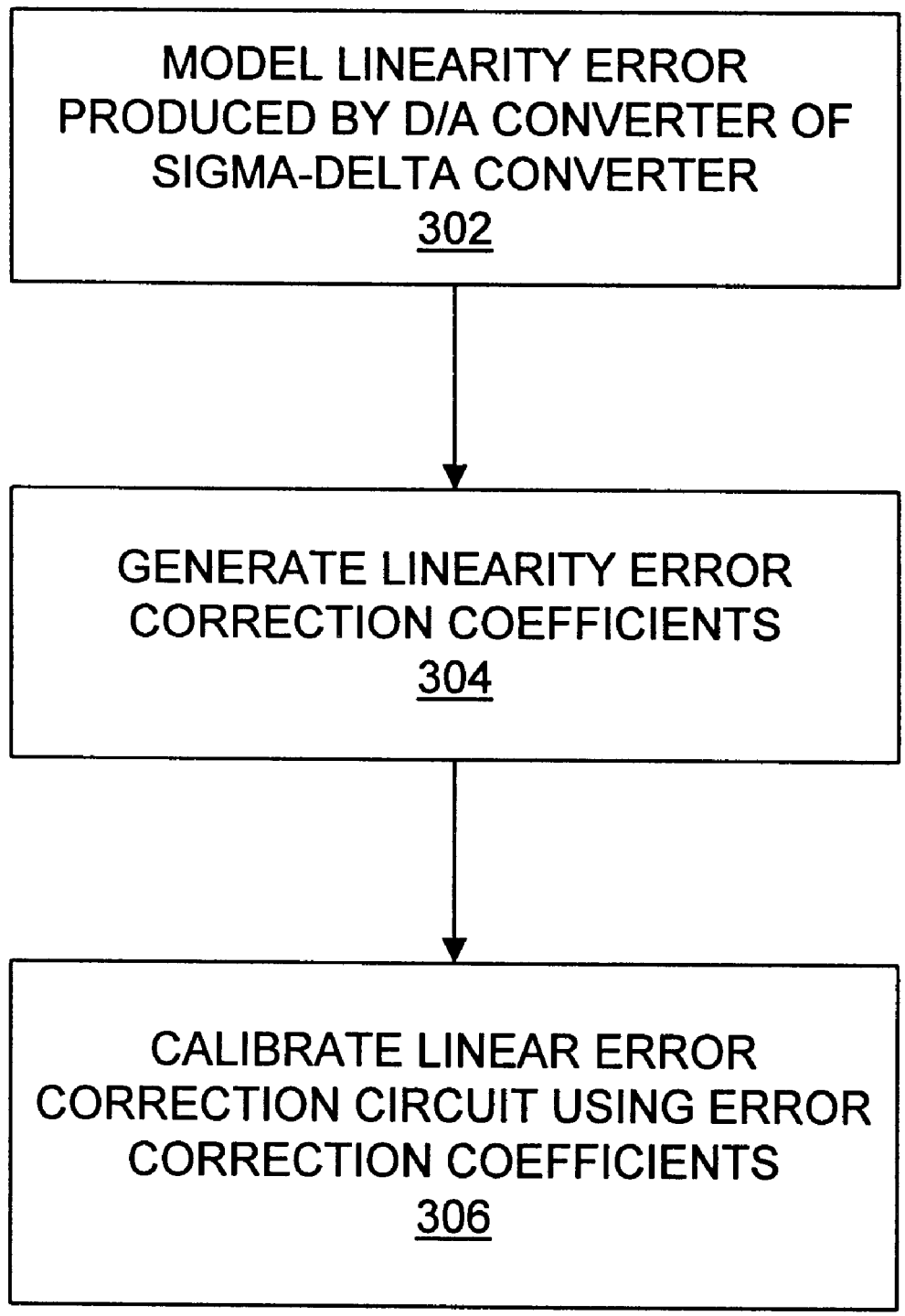
FIG. 9 is a top level flowchart which illustrates the calibration method for the internal D/A converter of the A/D converter.

FIG. 9—Top Level Flowchart

FIG. 9 shows, in general terms, the calibration operation performed in a multi-bit D/S converter, described above with reference to FIG. 6. As mentioned above, the present description is described with reference to the calibration method disclosed in U.S. Pat. Nos. 5,781,137 and 5,781,138, as well as the applications referenced above. However, the present invention may be used with any of various calibration methods, as desired.

In step 302 the DSP 222 and/or host computer 102 model the linearity error inherent in the D/A converter 210. The linearity error modeling performed in step 302 is shown in more detail in FIG. 10.

Based on the linearity error modeling, the host computer 102 generates correction coefficients in step 304. Thus, in the preferred embodiment, the host computer 102 generates the correction coefficients in software. However, it is noted that the correction coefficients may be generated by the processing unit 222 and/or device 104 (FIG. 11), either in hardware or software, or by a combination of the processing unit 222, DAQ device 104 and/or host computer 102, or by an external system.

Thereafter, in step 306, the linearity error correction coefficients are used to configure or calibrate the L/E correction circuit 224 comprised on the board 104. In the preferred embodiment, as discussed above, the processing unit 222 implements the L/E correction circuit 224. The L/E correction circuit 224 is preferably a look up table which maps received digital values to corrected values.

Once the L/E correction circuit 224, i.e., the processing unit 222, is properly configured, the delta sigma converter may be used for analog to digital conversion (in the A/D mode). Thus, as shown in FIG. 5, an input voltage $V_{in}$ is applied to the delta-sigma converter input summing node 204, $V_{in}$ is digitally sampled, and the digital samples are provided to the processing unit 222 for L/E correction. The processing unit 222 in turn translates the digital samples into values with reduced linearity errors.

The linearity error information may also be used in calibrating operation of the internal D/A converter 210 when the system is operating in the D/A mode, as described above with respect to FIGS. 7 and 8. Thus the same L/E correction circuit 224 (i.e., the same L/E correction values) may be used in the D/A mode as well.

Figure 10:
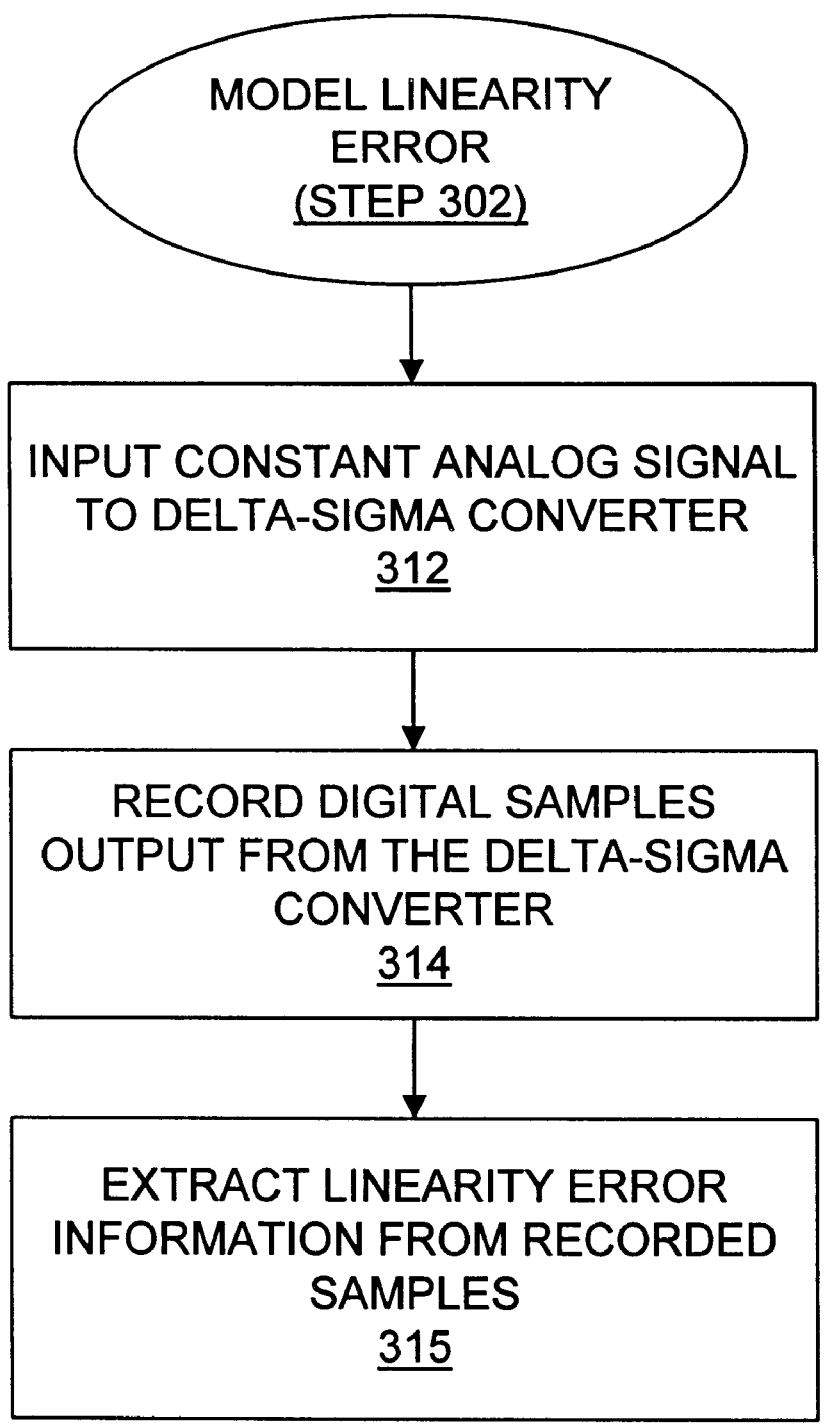
FIG. 10 is a more detailed flowchart diagram illustrating how linearity errors are modeled or extracted according to the calibration method of FIG. 9.

FIG. 10—Modeling of Linearity Errors.

With reference to FIG. 6, FIG. 10 illustrates operation of step 302 of FIG. 9, i.e., FIG. 10 illustrates modeling of linearity errors performed in step 302 of FIG. 9.

As shown, in step 312 an analog signal, such as a constant analog signal or waveform, may be input to the D/S modulator. This is accomplished by selectively connecting an analog source, such as a constant voltage source, e.g., logical ground, or a waveform generator, e.g., a sine wave, to the input of summing node 204, as shown in FIG. 6.

In step 314 the acquisition memory 232 collects and stores a set S of digital samples of the output by the D/S modulator. Here it is noted that digital correction 224 and decimation 226 may not be performed on the output of the D/S modulator, but rather the digital samples are recorded directly in the acquisition memory 232.

The digital samples output from the D/S converter are preferably continuously recorded in step 314.

After the set S of digital samples or digital signals are recorded in step 314, in step 315 linearity error information is extracted. Step 315 may be performed by the host computer 102 or by on-board processing unit 222. The linearity error information may be extracted in many ways. The linearity error information contains information on linearity errors associated with a majority or all of the current generators. The linearity error information contains information corresponding to active states of the current generators internal to the D/A converter 210 in the A/D converter system.

The linearity error information may then be used to generate linearity error correction coefficients in step 304 and calibrate or configure the linearity error correction circuit in step 306. Each of the linearity error correction coefficients may correspond to a particular active state of one of the current generators internal to the D/A converter 210 in the A/D converter system. The preferred operation of extracting linearity error information in step 315, and the preferred operations of generating linearity error correction coefficients in step 304 and calibrating or configuring the linearity error correction circuit in step 306 are discussed in U.S. Pat. Nos. 5,781,137 and 5,781,138, which were incorporated by reference above, as well as the patent applications referenced above and incorporated by reference herein. The present invention may also be used with other calibration techniques, as desired.

Dynamic Re-calibration

The current generators contained within the internal D/A converter 210 may vary with time and temperature. Accordingly, the linearity error associated thereto may likewise vary over time and temperature. Thus, the L/E circuit 224 may be recalibrated over time and use, in order to account for changing linearity errors. In other words, the L/E circuit 224 may be dynamically recalibrated during use. To recalibrate, the above method is performed, and the host computer 102 generates a new set of correction coefficients c(m) and reconfigures the L/E correction circuit 224 in accordance thereto. In this manner, the resolution of the D/S converter can be maximized throughout its use.

FIG. 11—DAQ System

Figure 11:
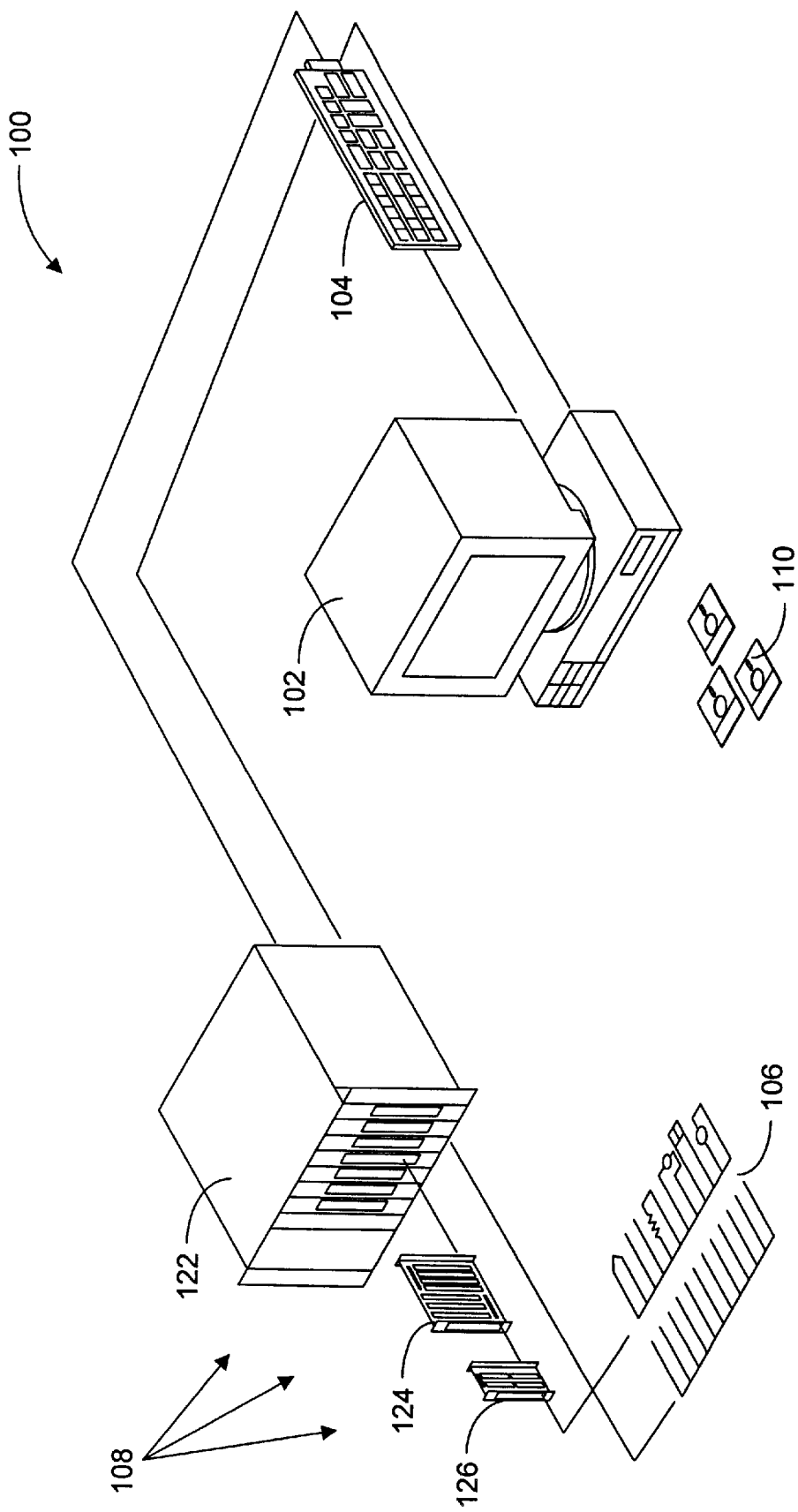
FIG. 11 illustrates an exemplary data acquisition (DAQ) system which includes the A/D converter employing the present invention.

FIG. 11 illustrates a system which includes an analog to digital (A/D) converter employing the present invention. In the preferred embodiment, the present invention is comprised in a data acquisition (DAQ) system. However, the present invention may be included in any of various types of systems where an analog to digital converter is used, i.e., where analog data is converted to digital data. Examples of systems where the present invention may be used include data acquisition systems, instrumentation systems, test and measurement systems, industrial automation systems, process control systems, communications systems, telephony systems, audio systems, and video systems, among others.

FIG. 11 shows an illustrative DAQ system 100. The system 100 comprises a computer 102, a DAQ device or board 104 coupled to the computer 102, and transducers 106 or other detecting means which provide field electrical signals to the DAQ device 104, optionally through signal conditioning circuitry 108. The DAQ board 104 is preferably comprised in the computer system 102, but is shown external to the computer system 102 for illustrative purposes. The term "data acquisition" used in this specification is intended to encompass data generation as well as data acquisition, one example being with reference to instrumentation and process control systems.

The computer 102 may include various standard components, including at least one central processing unit (CPU), non-volatile memory, such as a hard drive, system memory, one or more buses, and a power supply. The computer 102 preferably includes a memory medium on which computer programs according to the present invention may be stored. As used herein, the terms "memory" or "memory medium" includes an installation medium, e.g., floppy disk(s) 110 or a CD-ROM, a system memory such as DRAM, SRAM, etc., and/or a non-volatile memory, such as a magnetic medium. The computer programs stored in the computer 102 preferably implement the calibration functions described above, and may also operate to configure the A/D converter system in either the A/D mode or the D/A mode. The computer 102 may thus operate to configure the A/D converter system in either the A/D mode or the D/A mode by, for example, writing a value to the processing unit 222.

In one embodiment, the computer 102 comprises input/output (I/O) slots into which the DAQ device 104 is coupled. In another embodiment, the computer 102 comprises a VXI (VME Extensions for Instrumentation) chassis and bus, a GPIB (General Purpose Interface Bus), a serial port or parallel port by which the DAQ device 104 is coupled to the computer 102.

Numerous variations and modifications will become apparent to those skilled in the art once the above disclosure is fully appreciated. It is intended that the following claims be interpreted to embrace all such variations and modifications.

What is claimed is:

1. An analog to digital (A/D) converter having analog to digital (A/D) and digital to analog (D/A) modes, comprising:
   an analog input for receiving an analog input signal from an external analog source;
   an internal A/D converter coupled to the analog input;
   an internal D/A converter coupled to the internal A/D converter;
   a digital input for receiving a digital input signal from an external digital source;
   wherein the analog input, the internal A/D converter, and the internal D/A converter collectively operate as the A/D converter in the A/D mode;
   wherein, in the A/D mode, the A/D converter is operable to receive the analog input signal on the analog input from the external analog source and generate a corresponding output digital signal;
   wherein, in the D/A mode, the internal D/A converter is operable to receive the input digital signal on the digital input from the external digital source and generate a corresponding output analog signal.

2. The A/D converter of claim 1, further comprising:
   a first switching element coupled to an input of the internal D/A converter, wherein the first switching element is operable in the D/A mode to receive the input digital signal and provide the input digital signal to the internal D/A converter; and
   a second switching element coupled to the output of the internal D/A converter, wherein the second switching element is operable in the D/A mode to receive the output analog signal output from the internal D/A converter and provide the output analog signal output from the A/D converter.

3. The A/D converter of claim 2, wherein the first switching element is operable in the A/D mode to receive an output of the internal A/D converter and provide the output of the internal A/D converter to the input of the internal D/A converter;
   wherein the second switching element is operable in the A/D mode to receive an output of the internal D/A converter and provide the output of the internal D/A converter through a feedback path coupled to the input of the internal A/D converter.

4. The A/D converter of claim 1, wherein the A/D converter further includes:
   a processor coupled to the internal D/A converter which is operable to utilize linearity error correction information for correcting linearity errors in the internal D/A converter.

5. The A/D converter of claim 4, wherein said linearity error information is useable in correcting linearity errors in the internal D/A converter in both the A/D mode and the D/A mode.

6. The A/D converter of claim 4, wherein the processor is operable to configure a linearity error correction table using the linearity error correction information for correcting linearity errors in the internal D/A converter;
   wherein the linearity error correction table is used in one or more of the A/D mode and the D/A mode to correct linearity errors in the internal D/A converter.

7. The A/D converter of claim 4, wherein the internal D/A converter includes a plurality of current generators, wherein one or more of the current generators produces linearity errors in the A/D converter;
   wherein said linearity error correction information operates to correct for linearity errors produced by the plurality of current generators in the internal D/A converter.

8. The A/D converter of claim 4,
   wherein, in the D/A mode, the processor is configured to implement:
   an interpolating filter operable to receive the input digital signal;
   a summation unit coupled to the output of the interpolating filter and configured to receive an output of the interpolating filter and a feedback signal;
   a rounding unit coupled to the output of the summation unit; and
   a linear error correction device coupled to the output of the rounding unit and which provides the feedback signal to the summation unit, wherein the linear error correction device uses the linearity error information for correcting linearity errors in the internal D/A converter;

wherein the internal D/A converter is coupled to receive an output from the rounding unit.

9. The A/D converter of claim 4, further comprising:

a computer system coupled to the A/D converter, wherein the computer system is operable to generate the linearity error correction information during a calibration of the A/D converter.

10. The A/D converter of claim 1, wherein the A/D converter is a sigma delta analog to digital converter.

11. The A/D converter of claim 10, further comprising:

a summing junction coupled to the analog input for receiving the analog input signal, wherein the summing junction is also coupled to the internal D/A converter and operates to receive an output from the internal D/A converter, wherein the summing junction sums the analog input and the output from the internal D/A converter and provides a summed output to the internal A/D converter;

wherein the summing junction, the internal A/D converter, and the internal D/A converter coupled to the internal A/D converter are comprised in a feedback loop a first switching element coupled to the input of the internal D/A converter, wherein the first switching element is operable in the A/D mode to receive an output of the internal A/D converter and provide the output of the internal A/D converter to an input of the internal D/A converter, wherein the first switching element is operable in the D/A mode to receive the input digital signal and provide the input digital signal to the internal D/A converter; and a second switching element coupled to the output of the internal D/A converter, wherein the second switching element is operable in the A/D mode to receive an output of the internal D/A converter and provide the output of the internal D/A converter through a feedback path coupled to the input of the internal A/D converter, wherein the second switching element is operable in the D/A mode to receive the output analog signal output from the internal D/A converter and provide the output analog signal output from the A/D converter.

12. The A/D converter of claim 1, wherein the internal D/A converter includes a plurality of current generators, wherein one or more of the current generators produces linearity errors in the A/D converter;

wherein the A/D converter further includes:

a processor coupled to the internal D/A converter which is operable to utilize linearity correction error information in calibrating the internal D/A converter in both the A/D mode and the D/A mode.

13. The A/D converter of claim 1, wherein the internal D/A converter is used in a feedback loop during A/D operations in the A/D mode.

14. A method for operating an analog to digital (A/D) converter in analog to digital (A/D) and digital to analog (D/A) modes, wherein the A/D converter includes an internal A/D converter and an internal D/A converter, the method comprising:

configuring the A/D converter in the A/D mode, wherein, in the A/D mode, the method comprises:

receiving an input analog signal at an analog input of the A/D converter;

the A/D converter generating an output digital signal corresponding to the input analog signal, wherein said generating the output digital signal includes the internal D/A converter operating in a feedback loop with the internal A/D converter to generate the output digital signal;

configuring the A/D converter in the D/A mode, wherein, in the D/A mode, the method comprises:

receiving an input digital signal at an input of the A/D converter, wherein the input digital signal is provided from an external source;

the internal D/A converter generating an output analog signal corresponding to the input digital signal, wherein the output analog signal is provided as an output of the A/D converter.

15. The method of claim 14, further comprising:

performing linearity error correction to correct linearity errors in the internal D/A converter in at least one of the A/D mode and the D/A mode.

16. The method of claim 15, further comprising:

generating linearity error correction information for correcting linearity errors in the internal D/A converter;

configuring a linearity error correction table using the linearity error correction information;

wherein said performing linearity error correction uses the linearity error correction table.

17. The method of claim 16, wherein the internal D/A converter includes a plurality of current generators, wherein one or more of the current generators produces linearity errors in the A/D converter;

wherein said performing linearity error correction corrects for linearity errors produced by the plurality of current generators in the internal D/A converter.

18. The method of claim 17, wherein said generating linearity error correction information comprises:

applying an analog input into the A/D converter;

recording a plurality of output digital signals from the A/D converter after said applying; and generating the linearity error correction information from the recorded plurality of output digital signals.

19. The method of claim 14, wherein, in the A/D mode, the method further comprises:

the internal D/A converter receiving the output digital signal and converting the output digital signal into a feedback analog signal;

wherein the feedback analog signal is provided as a feedback signal to the internal A/D converter.

20. The method of claim 19, further comprising:

in the D/A mode, selectively providing the input digital signal to the internal D/A converter; and selectively providing the output analog signal from the internal D/A converter to an output of the A/D converter; and in the A/D mode, selectively providing the output digital signal from the internal A/D converter to the internal D/A converter; and selectively providing the feedback analog signal from the internal D/A converter as a feedback signal to the internal A/D converter.

21. The method of claim 14, wherein, in the A/D mode, the method further comprises:

performing linearity error correction to correct linearity errors in the internal D/A converter.

22. The method of claim 14,
wherein, in the D/A mode, the method further comprises:
performing linearity error correction to correct linearity errors in the internal D/A converter.

23. A method for operating an analog to digital (A/D) converter in analog to digital (A/D) and digital to analog (D/A) modes, wherein the A/D converter includes an internal D/A converter, wherein the internal D/A converter operates in the A/D converter in the A/D mode, the method comprising:
configuring the A/D converter in the D/A mode;
receiving an input digital signal at an input of the A/D converter, wherein the input digital signal is provided from an external source; and
the internal D/A converter performing digital to analog conversion to generate an output analog signal corresponding to the input digital signal, wherein the output analog signal is provided as an output of the A/D converter.

24. The method of claim 23,
wherein the A/D converter also includes an internal A/D converter;
wherein the internal A/D converter and the internal D/A converter operate collectively in the A/D mode.

25. The method of claim 24, wherein the internal D/A converter is used in a feedback loop during A/D operations in the A/D mode.

26. The method of claim 23, further comprising:
performing analog to digital conversion on a received input analog signal, wherein said performing analog to digital conversion uses the internal D/A converter, wherein said performing analog to digital conversion is performed prior to said configuring the A/D converter in the D/A mode.

27. The method of claim 23,
configuring the A/D converter in the A/D mode;
providing an input analog signal to an analog input of the A/D converter, wherein the input analog signal is provided from an external source;
the A/D converter performing analog to digital conversion to generate an output digital signal corresponding to the input analog signal, wherein said performing analog to digital conversion uses the internal D/A converter.

28. The method of claim 23, further comprising:
performing linearity error correction on the internal D/A converter during the internal D/A converter performing digital to analog conversion.

29. An analog to digital (A/D) converter system having analog to digital (A/D) and digital to analog (D/A) modes, comprising:
an analog input for receiving an analog input signal from an external analog source;
an internal A/D converter coupled to the analog input;
an internal D/A converter coupled to the internal A/D converter;
a processor which is selectively coupled to the internal A/D converter in the A/D mode and is selectively coupled to the internal D/A converter in the D/A mode;
a digital input coupled to the processor for receiving a digital input signal from an external digital source;
wherein, in the A/D mode, the internal A/D converter is operable to receive the analog input signal and generate a corresponding output digital signal;
wherein, in the D/A mode, the processor is operable to receive the input digital signal, and the processor and the internal D/A converter are operable to generate a corresponding output analog signal.

30. The A/D converter system of claim 29,
wherein, in the D/A mode, the processor is configured to implement a linear error correction device which corrects for linearity errors in the internal D/A converter.

31. The A/D converter system of claim 30,
wherein, in the A/D mode, the processor is configured to implement a linear error correction device which corrects for linearity errors in the internal D/A converter.

32. The A/D converter of claim 31, further comprising:
a computer system coupled to the A/D converter system, wherein the computer system is operable to generate linearity error correction information to configure the linear error correction device.

33. The A/D converter system of claim 29,
wherein the analog input, the internal A/D converter, and the internal D/A converter collectively operate as the A/D converter in the A/D mode.

34. The A/D converter system of claim 33, wherein the internal D/A converter is used in a feedback loop during A/D operations in the A/D mode.

35. The A/D converter system of claim 29,
wherein, in the D/A mode, the processor is configured to implement:
an interpolating filter operable to receive the input digital signal;
a summation unit coupled to the output of the interpolating filter and configured to receive an output of the interpolating filter and a feedback signal;
a rounding unit coupled to the output of the summation unit; and
a linear error correction device coupled to the output of the rounding unit and which provides the feedback signal to the summation unit, wherein the linear error correction device corrects for linearity errors in the internal D/A converter;
wherein the internal D/A converter is coupled to receive an output from the rounding unit.

36. The A/D converter system of claim 29,
wherein, in the A/D mode, the processor is configured to implement:
a linear error correction device which corrects for linearity errors in the internal D/A converter; and
a decimator for decimating the output digital signal.

37. The A/D converter system of claim 29, wherein the A/D converter system includes a sigma delta analog to digital converter.

* * * * *